United States Patent [19]
Foote et al.

[11] Patent Number: 5,536,333
[45] Date of Patent: * Jul. 16, 1996

[54] PROCESS FOR MAKING PHOTOVOLTAIC DEVICES AND RESULTANT PRODUCT

[75] Inventors: James B. Foote, Toledo; Steven A. F. Kaake, Perrysburg; Peter V. Meyers, Bowling Green; James F. Nolan, Sylvania, all of Ohio

[73] Assignee: Solar Cells, Inc., Toledo, Ohio

[*] Notice: The term of this patent shall not extend beyond the expiration date of Pat. No. 5,248,349.

[21] Appl. No.: 515,231

[22] Filed: Aug. 15, 1995

Related U.S. Application Data

[62] Division of Ser. No. 300,406, Sep. 2, 1994, Pat. No. 5,470,397, which is a division of Ser. No. 66,348, May 24, 1993, Pat. No. 5,372,646, which is a division of Ser. No. 881,683, May 12, 1992, Pat. No. 5,248,349.

[51] Int. Cl.$^6$ ............... H01L 31/06; H01L 31/072; H01L 31/18; H01L 31/078
[52] U.S. Cl. ............... 136/260; 136/258; 136/264; 427/76; 437/5; 437/234; 257/184; 257/201; 257/431; 257/458
[58] Field of Search ............... 437/4–5; 429/76; 136/258 PC, 260, 264; 257/184, 201, 431, 458

[56] References Cited

U.S. PATENT DOCUMENTS

| | | | |
|---|---|---|---|
| 4,015,558 | 4/1977 | Small et al. | 118/729 |
| 4,125,391 | 11/1978 | Van Laethem | 118/729 |
| 4,465,575 | 8/1984 | Love et al. | 136/264 |
| 4,650,921 | 3/1987 | Mitchell | 136/258 |
| 4,697,974 | 10/1987 | Eltoukhy | 118/729 |
| 5,016,562 | 5/1991 | Madan et al. | 118/729 |
| 5,086,729 | 2/1992 | Katagiri | 118/729 |
| 5,248,349 | 9/1993 | Foote et al. | 136/260 |
| 5,372,646 | 12/1994 | Foote et al. | 118/719 |

OTHER PUBLICATIONS

P. V. Meyers, Solar Cells, vol. 27, pp. 91–98 (1989) (Oct.–Dec.).

"Harnessing Solar Power—The Photovoltaics Challenge", Chapter 11, by Ken Zweibel, Published by Plenum Press of New York and London.

*Primary Examiner*—Aaron Weisstuch
*Attorney, Agent, or Firm*—Brooks & Kushman

[57] ABSTRACT

A process and apparatus (70) for making a large area photovoltaic device (22) that is capable of generating low cost electrical power. The apparatus (70) for performing the process includes an enclosure (126) providing a controlled environment in which an oven (156) is located. At least one and preferably a plurality of deposition stations (74,76,78) provide heated vapors of semiconductor material within the oven (156) for continuous elevated temperature deposition of semiconductor material on a sheet substrate (24) including a glass sheet (26) conveyed within the oven. The sheet substrate (24) is conveyed on a roller conveyor (184) within the oven (156) and the semiconductor material whose main layer (82) is cadmium telluride is deposited on an upwardly facing surface (28) of the substrate by each deposition station from a location within the oven above the roller conveyor. A cooling station (86) rapidly cools the substrate (24) after deposition of the semiconductor material thereon to strengthen the glass sheet of the substrate.

23 Claims, 4 Drawing Sheets

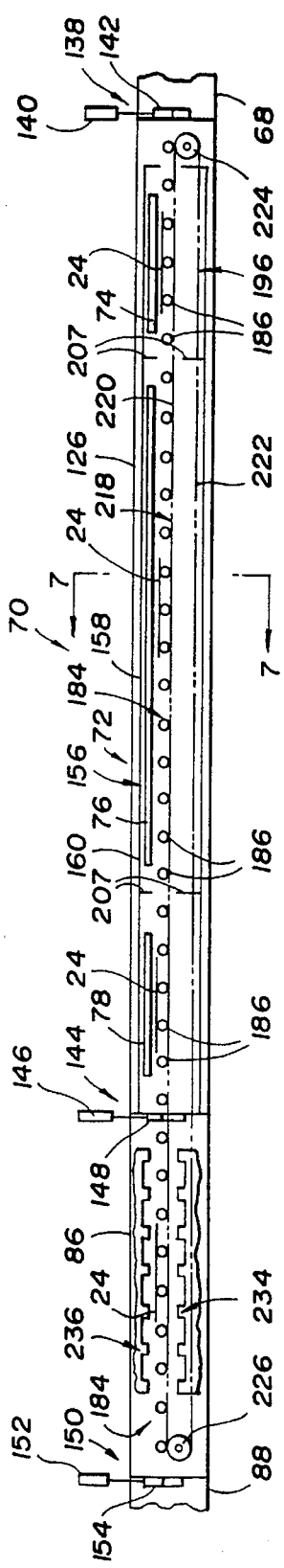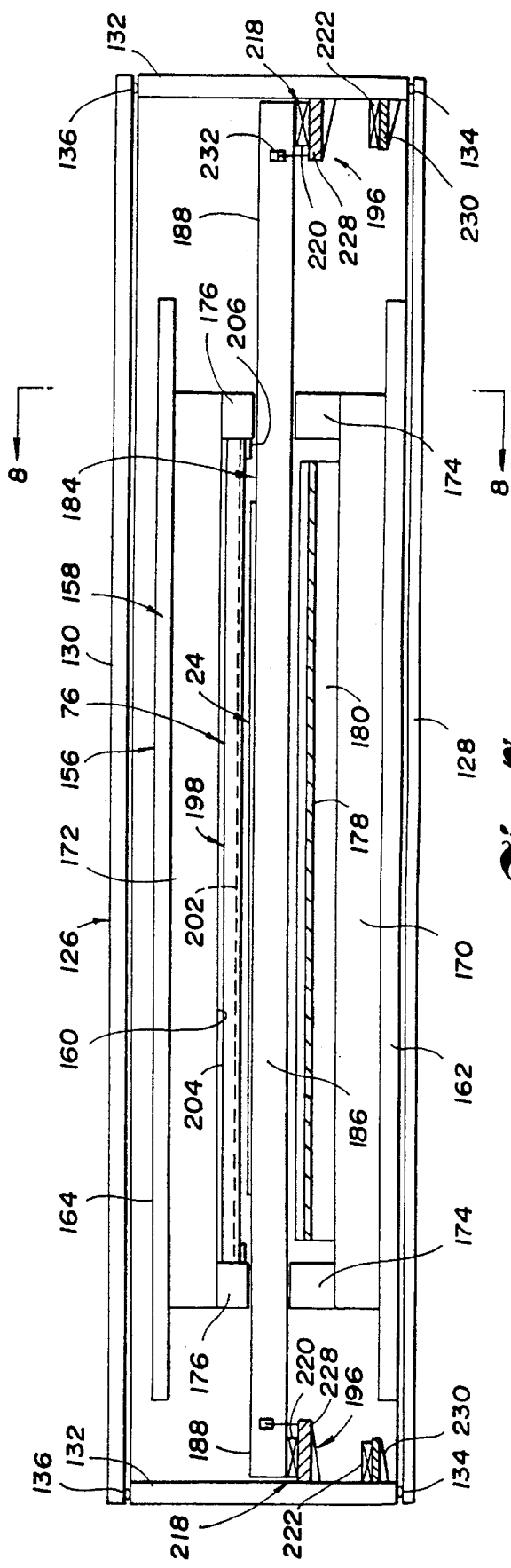

PROCESS FOR MAKING PHOTOVOLTAIC DEVICES AND RESULTANT PRODUCT

This invention was made with Government support under SERI Subcontract Number ZR-1-11059-1 with Solar Cells, Inc. awarded by the Department of Energy. The Government has certain rights in this invention.

This is a divisional of application Ser. No. 08/300,406 filed on Sep. 2, 1994 now U.S. Pat. No. 5,470,397 of James B. Foote et al for PROCESS FOR MAKING PHOTOVOLTAIC DEVICES AND RESULTANT PRODUCT, which is a divisional of prior Ser. No. 08/066,348 filed on May 24, 1993 entitled APPARATUS FOR MAKING PHOTOVOLTAIC DEVICES, now U.S. Pat. No. 5,372,646, which is a divisional of application Ser. No. 07/881,683 filed on May 12, 1992 entitled PROCESS AND APPARATUS FOR MAKING PHOTOVOLTAIC DEVICES AND RESULTANT PRODUCT, now U.S. Pat. No. 5,248,349 which issued on Sep. 28, 1993.

TECHNICAL FIELD

This invention relates to a process and apparatus for making photovoltaic devices and also relates to the resultant product for converting light to electricity.

BACKGROUND ART

The photovoltaic effect was first observed in 1839 by Edmund Becquerel when he noted that a voltage appeared across two identical electrodes in a weak conducting solution that was subjected to light. This photovoltaic effect was first studied in solids such as selenium in the 1870's and by the 1880's, selenium photovoltaic cells were produced with 1 to 2% efficiency in converting light to electricity.

Since the initial experimentation with photovoltaics over a century ago, much work has been conducted in developing semiconductors for photovoltaic devices, i.e. solar cells. Much of the initial work was done with crystalline silicon which requires a relatively thick film such as on the order of about 100 microns and also must be of very high quality in either a single-crystal form or very close to a single crystal in order to function effectively. The most common process for making silicon cells is by the single-crystal cylinder process where a single-crystal silicon seed crystal is touched to a molten silicon melt and then withdrawn to provide a raised meniscus of molten silicon with both the seed crystal and the crucible holding the melt rotated oppositely to enhance radial growth. Suitable doping will make the cell either an N-type or a P-type semiconductor and upon slicing into a wafer of about 100 microns and formation of a junction will produce a solar cell or photovoltaic device. In addition, crystalline silicon can be made by casting of an ingot but its solidification is not as easily controlled as with single-crystal cylinders such that the resultant product is a polycrystalline structure. Direct manufacturing of crystalline silicon ribbons has also been performed with good quality as well as eliminating the necessity of cutting wafers to make photovoltaic devices. Another approach referred to as melt spinning involves pouring molten silicon onto a spinning disk so as to spread outwardly into a narrow mold with the desired shape and thickness. High rotational speeds with melt spinning increase the rate of formation but at the deterioration of crystal quality.

More recent photovoltaic development has involved thin films which have a thickness less than 10 microns so as to be an order of magnitude thinner than thick film semiconductors. Such thin film semiconductors include amorphous silicon, copper indium diselenide, gallium arsenide, copper sulfide and cadmium telluride. Amorphous silicon has been made into thin film semiconductors by plasma enhanced discharge, or glow discharge, as disclosed by U.S. Pat. No. 5,016,562. Other processes used to make thin film semiconductors include electrodeposition, screen printing and close-spaced sublimation. The close-spaced sublimation process has been used with cadmium telluride and is performed by inserting a glass sheet substrate into a sealed chamber that is then heated. The glass sheet substrate is supported at its periphery in a very close relationship, normally 2 to 3 mm, to a source material of cadmium telluride. After the heating has proceeded to about 450°–500° C., the cadmium telluride begins to sublime very slowly into elemental cadmium and tellurium and, upon reaching a temperature of about 650°–725° C., the sublimation is at a greater rate and the elemental cadmium and tellurium recombines at a significant rate as cadmium telluride on the downwardly facing surface of the peripherally supported glass sheet substrate. The heating is subsequently terminated prior to opening of the chamber and removal of the substrate with the cadmium telluride deposited on the substrate. Thus, the deposition of the cadmium telluride is at a varying temperature that increases at the start of the processing and decreases at the end of the processing. Furthermore, the largest area on which such close-spaced sublimation has previously been conducted is about 100 cm.$^2$ square. Increasing the size of the substrate can cause problems in maintaining planarity since the heated substrate which is supported at only its periphery will tend to sag at the center.

A more complete discussion of cadmium telluride processing is set forth in Chapter 11 of the book "*Harnessing Solar Power—The Photovoltaics Challenge*" by Ken Zweibel, published by Plenum Press of New York and London.

DISCLOSURE OF INVENTION

An object of the present invention is to provide an improved process and apparatus for making photovoltaic devices capable of producing low cost electrical power which is achieved by the use of large area glass sheet substrates, i.e. over 1000 cm.$^2$, on which high quality semiconductor material is deposited at a relatively fast rate of deposition.

In carrying out the above object and other objects of the invention, the process for making a photovoltaic device in accordance with the invention is performed by establishing a contained environment heated in a steady state during the processing to a temperature in a range above about 650° C. and by introducing vapors of cadmium and tellurium into the contained environment. A sheet substrate including a glass sheet heated to a temperature in the range of about 550° to 640° C. is conveyed within the contained environment for continuous elevated temperature deposition of a layer of cadmium telluride onto one surface of the substrate to function as a semiconductor for absorbing solar energy.

In the preferred practice of the process, the substrate is oriented horizontally within the contained environment with the one surface of the substrate facing upwardly for the deposition of the cadmium telluride thereon and with the other surface of the substrate facing downwardly and being supported within the periphery thereof for horizontal conveyance. Most preferably, the substrate is supported and conveyed within the contained environment by horizontally extending rolls of a roller conveyor during the deposition of the layer of cadmium telluride onto the one upwardly facing surface of the substrate in order to allow the deposition on large area substrates.

In the preferred practice of the process, another semiconductor material is deposited onto the upwardly facing surface of the substrate as a separate layer having an interface with the layer of cadmium telluride such that an electrical junction can be formed either upon the initial deposition or by subsequent treatment. More specifically, another semiconductor material is deposited as another layer onto the one surface of the substrate before the layer of cadmium telluride which is deposited thereover and has an interface with the layer of cadmium telluride. This layer of semiconductor material deposited onto the one surface of the substrate before the layer of cadmium telluride is preferably cadmium sulfide. The additional layer of semiconductor material may also be deposited as another layer onto the one surface of the substrate after the layer of cadmium telluride so as to have an interface with the layer of cadmium telluride on the opposite side thereof from the substrate. As specifically disclosed, the process is performed by depositing another semiconductor material as another layer onto the one surface of the substrate before the layer of cadmium telluride which is deposited thereover and has an interface with the layer of cadmium telluride, and by also depositing a further semiconductor material as a further layer on the one surface of the substrate after the layer of cadmium telluride so as to have a further interface with the layer of cadmium telluride.

In the preferred practice of the process, each layer of semiconductor material in addition to the layer of cadmium telluride is deposited by introducing vapors into the contained environment, which is heated to a temperature in the range above about 650° C., for the deposition on the one surface of the substrate during the conveyance thereof while heated to the temperature range of about 550° to 640° C.

After the deposition of the layer of cadmium telluride, the processing is preferably performed by rapidly cooling the substrate at a rate that provides compressive stresses that strengthen the glass sheet. More specifically, the deposition of the layer of cadmium telluride is most preferably performed with the substrate heated to a temperature in the range of about 570° to 600° C., and thereafter the substrate is heated to a temperature in the range of about 600° to 640° C. from which the rapid cooling is performed to provide the compressive stresses to strengthen the glass sheet.

In carrying out the objective of providing low cost electrical power, the apparatus constructed in accordance with the invention for making a photovoltaic device includes an enclosure having an interior for containing a controlled environment. An oven of the apparatus is located within the enclosure and has a housing that defines a heated chamber communicated with the interior of the enclosure such that the controlled environment is also within the heated chamber. A roller conveyor of the apparatus includes horizontal rolls spaced from each other within the heated chamber of the oven to support and convey a heated substrate which includes a glass sheet. Each roll has at least one end that extends outwardly from the heated chamber of the oven through its housing. The roller conveyor also includes a roll drive mechanism located within the interior of the enclosure externally of the oven to rotatively drive the roll ends that project outwardly from the heated chamber of the oven through its housing. At least one deposition station within the oven supplies heated vapor that is deposited as a layer of semiconductor material onto the upwardly facing surface of the substrate during conveyance thereof on the roller conveyor.

In its preferred construction, the apparatus includes an additional deposition station for depositing on the substrate an additional layer of another semiconductor material that has an interface with the first layer of semiconductor material. More specifically, the apparatus most preferably includes two additional deposition stations. One of the two additional deposition stations deposits on the substrate an additional layer of another semiconductor material before the first mentioned layer of semiconductor material so as to have an interface therewith, and the other of the two additional deposition stations deposits on the substrate another additional layer of a further semiconductor material after the first mentioned layer of semiconductor material so as to have another interface therewith spaced from the other interface.

In one disclosed construction, the apparatus has the deposition station provided with a source material holder located within the oven above the roller conveyor to receive a source material that sublimes to provide the heated vapor that is deposited as the layer of semiconductor material. This source material holder of the deposition station most preferably includes a holder trough that opens upwardly, and the apparatus also preferably includes a deflector located above the source material holder and having a downwardly opening shape. Most preferably, the source material holder includes elongated holder troughs that open upwardly and extend parallel to the conveyor rolls in a spaced relationship to each other, and the apparatus also includes deflectors located above the elongated holder troughs and having downwardly opening shapes.

In another disclosed construction, the deposition station includes a heated vapor supply whose temperature can be controlled without affecting the temperature of the substrate in the oven, and the heated vapor supply has at least one supply conduit providing a means for feeding heated vapor to the deposition station for the deposition on the upwardly facing surface of the conveyed substrate as the layer of semiconductor material. In one embodiment, the heated vapor supply includes a heater for supplying the heated vapor and a source of carrier gas for transferring the heated vapor from the heater through the supply conduit means to the deposition station. In another embodiment, the heated vapor supply includes a pair of heaters for supplying separate heated vapor components of the heated vapor, and the heated vapor supply also includes a source of carrier gas for transferring the heated vapor from each heater through the supply conduit means to the deposition station.

In the preferred construction of the apparatus, the drive mechanism includes a continuous drive loop that drives the ends of the conveyor rolls projecting outwardly from the oven within the enclosure that contains the controlled environment. More specifically, both ends of each conveyor roll preferably project outwardly from the oven at opposite sides thereof, and the drive mechanism includes a pair of continuous drive loops that respectively support and frictionally drive the conveyor roll ends on opposite sides of the oven within the enclosure that contains the controlled environment.

The preferred construction of the apparatus also includes a cooling station located downstream from the deposition station to rapidly cool the substrate with the layer of semiconductor material deposited thereon to thereby strengthen the glass sheet of the substrate and thereby provide a more durable product.

A photovoltaic device constructed in accordance with the invention includes a sheet substrate including a glass sheet having oppositely facing surfaces each of which has an area of at least 1000 square centimeters. A thin-film layer of cadmium telluride is deposited on one of the surfaces of the substrate with a thickness in the range of about 1 to 5 microns and has crystals of a size in the range of about ½ to 5 microns. The thin-film layer of cadmium telluride has a bond to the one surface of the substrate by deposition thereon while the glass sheet is heated to a temperature in the range of about 550° to 640° C. within a contained environment that is heated to a temperature in a range above about 650° C. and into which vapors of cadmium and tellurium are introduced for deposition on the one surface thereof as the layer of cadmium telluride. This photovoltaic device has good crystal quality and good adherence to respectively enhance the efficiency and the effective lifetime of the relatively large area device so as to thereby achieve the object of the invention to provide low cost electrical power.

In the preferred construction of the photovoltaic device, a layer of another semiconductor material is deposited on the one surface of the substrate and has an interface with the layer of cadmium telluride. This additional layer of another semiconductor material may be deposited on the one surface of the substrate before the layer of cadmium telluride to have an interface with the layer of cadmium telluride and, in such case, this additional layer of semiconductor material is preferably cadmium sulfide. The additional layer of another semiconductor may also be deposited on the one surface of the substrate after the layer of cadmium telluride so as to have an interface with the layer of cadmium telluride. In the preferred construction disclosed, the photovoltaic device includes another layer of another semiconductor material deposited on the one surface of the substrate before the layer of cadmium telluride and having an interface therewith, and the photovoltaic device also includes a further layer of a further semiconductor material deposited on the one surface of the substrate after the layer of cadmium telluride and having a further junction with the layer of cadmium telluride.

Furthermore, the photovoltaic device also preferably includes a first electrically conductive film on the one surface of the substrate over which the initially deposited layer is deposited and further includes a second electrically conductive film deposited on the one surface of the substrate over the finally deposited layer. These electrically conductive films function as electrodes for the photovoltaic device.

In its preferred construction, the photovoltaic device has the glass sheet of the substrate heat strengthened with oppositely facing surfaces in compression and a central portion in tension, and the cadmium telluride has a bond that is cooled from tempering temperature and provides adherence thereof to the one surface of the substrate.

The objects, features and advantages of the present invention are readily apparent from the following detailed description of the best modes for carrying out the invention when taken in connection with the accompanying drawings.

BRIEF DESCRIPTION OF DRAWINGS

FIG. 6 is an elevational view taken in longitudinal section along the direction of line 6—6 in FIG. 1 to illustrate apparatus of the invention which includes a deposition zone having a plurality of deposition stations and also includes a cooling station located downstream from the deposition zone;

FIG. 7 is a cross-sectional view taken along the direction of line 7—7 in FIG. 6 to further illustrate the construction of the deposition zone;

BEST MODES FOR CARRYING OUT THE INVENTION

Figure 1:
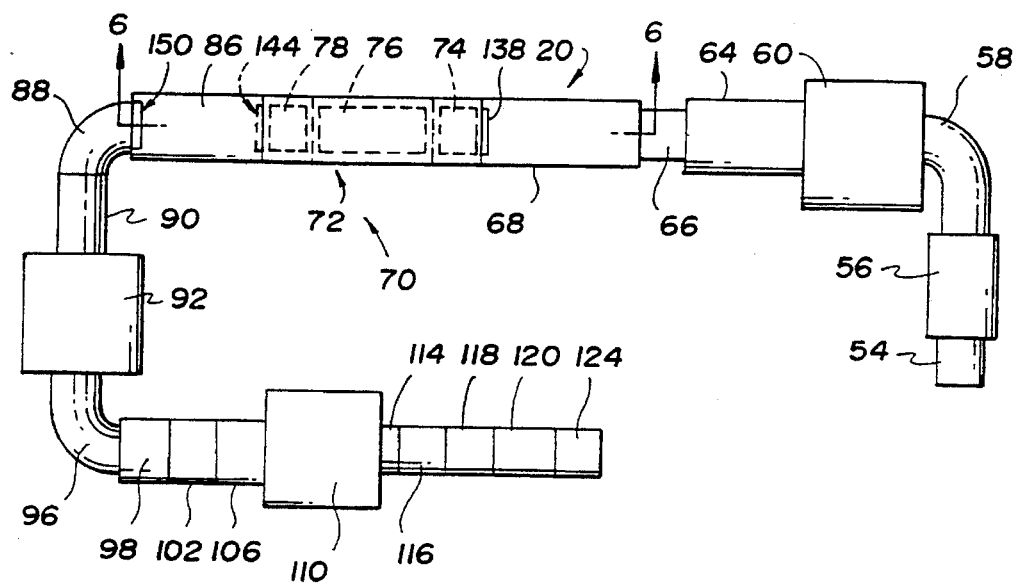
FIG. 1 is a schematic top plan view of a system for making photovoltaic devices in accordance with the invention.
Figure 2:
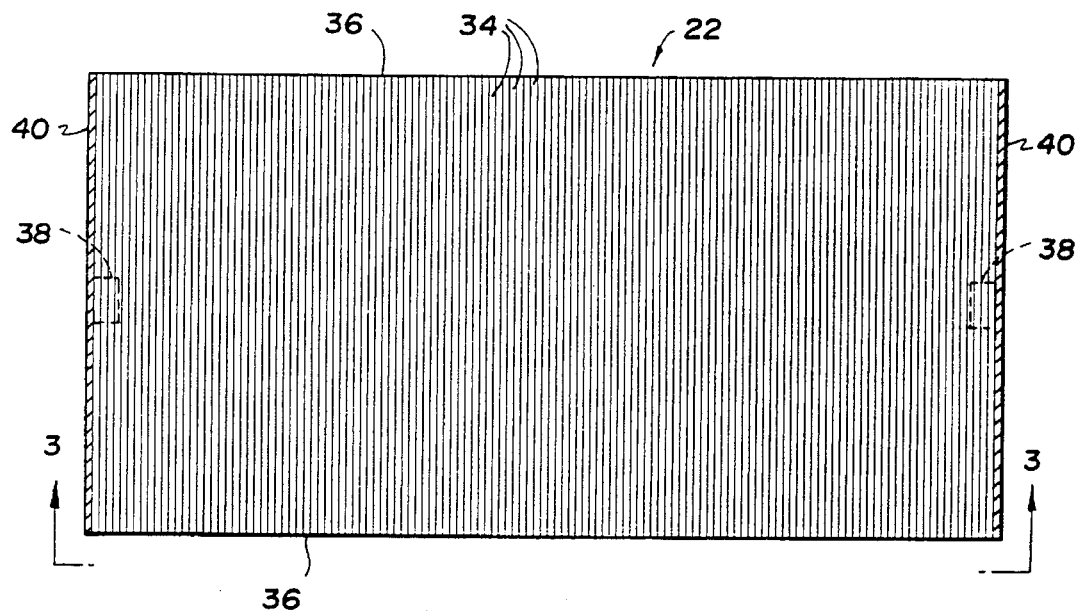
FIG. 2 is a plan view of a photovoltaic device constructed in accordance with the invention.
Figure 3:
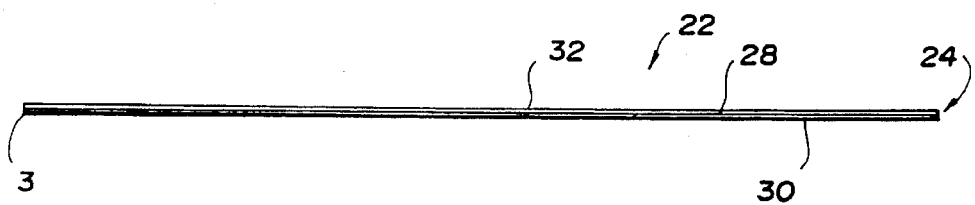
FIG. 3 is an edge view of the photovoltaic device taken along the direction of line 3—3 in FIG. 2 to illustrate its sheet construction.
Figure 4:
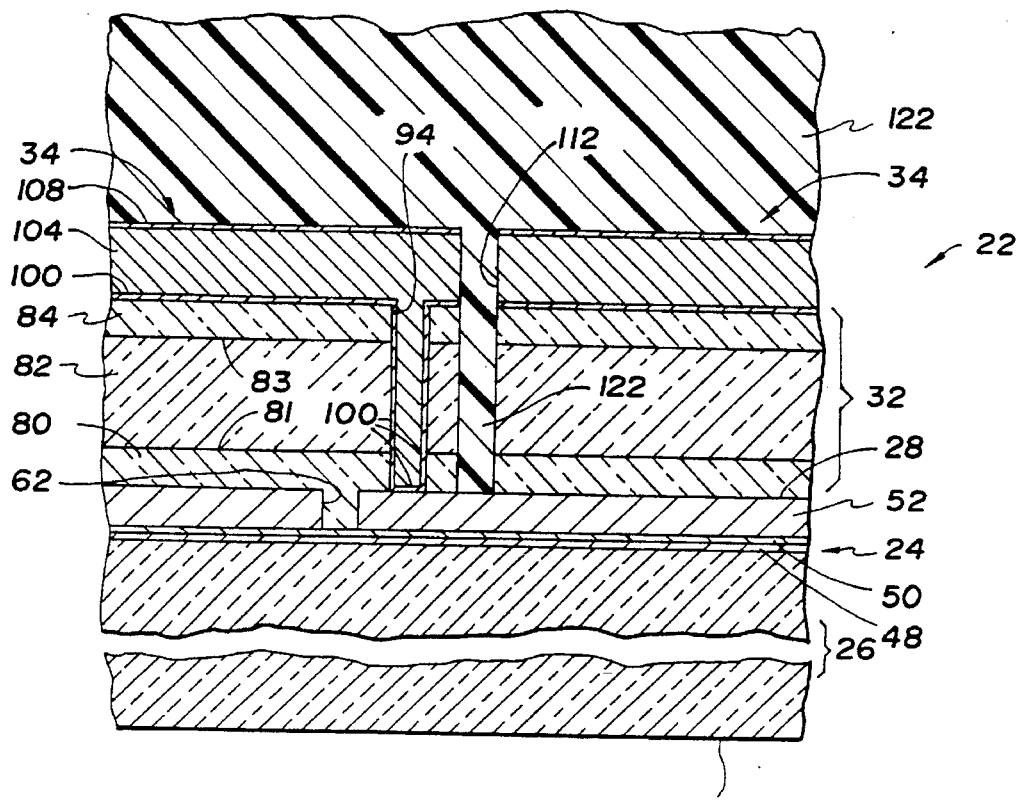
FIG. 4 is a sectional view of the photovoltaic device taken in the same direction as FIG. 3 but on an enlarged scale and partially broken away to illustrate the construction of deposited semiconductor material and other materials on a glass sheet of the substrate.
Figure 5:
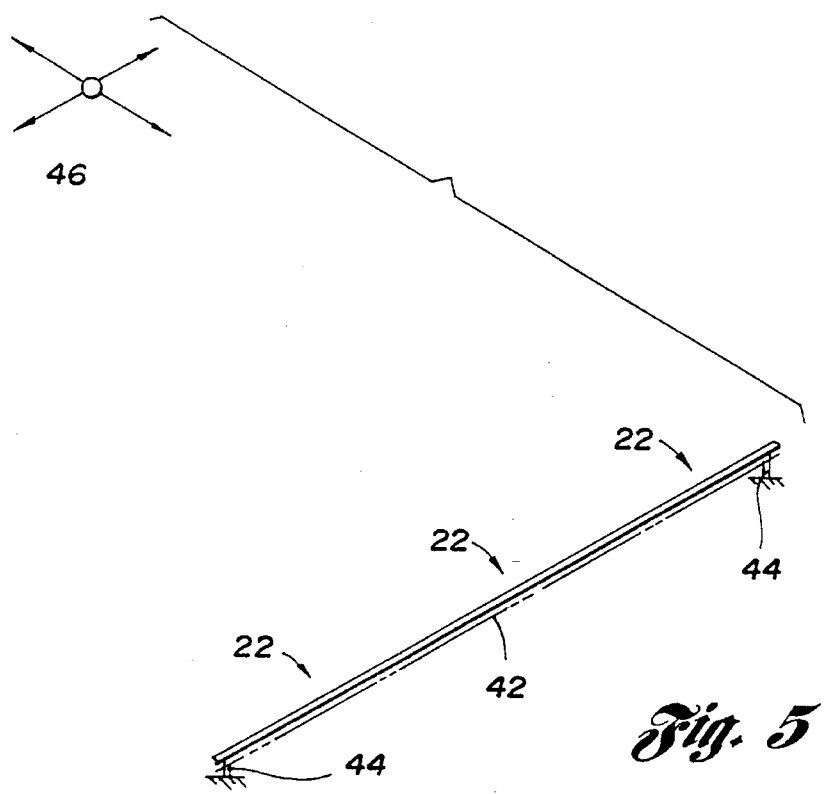
FIG. 5 is a view that illustrates the manner in which the photovoltaic device is utilized to absorb solar energy and thereby provide electrical power.

With reference to FIG. 1 of the drawings, a system generally indicated by 20 is constructed to manufacture photovoltaic devices 22 as illustrated in FIGS. 2 through 5. The type of photovoltaic device 22 or solar cell manufactured by the apparatus includes a sheet substrate 24 which includes a glass sheet 26 (FIG. 4) and has oppositely facing surfaces 28 and 30 as is hereinafter more fully described. In order to produce low cost electric power, the substrate 24 is of a large area which is greater than about 1000 square centimeters and the embodiment specifically illustrated has a size of 60 centimeters by 120 centimeters so as to be approximately 2 feet by 4 feet. After deposition of semiconductor material 32 (FIG. 4) on the one surface 28 of the substrate 24 as well as after other processing hereinafter more fully described, the completed photovoltaic device 22 has cells 34 which are illustrated as extending laterally between the opposite lateral sides 36 of the substrate and are connected in series with each other as is also hereinafter more fully described. Furthermore, it should be appreciated that the cells 34 could also extend longitudinally between the opposite ends 40 of the substrate and still function effectively. Electrical terminals 38 at the opposite ends 40 of the substrate provide for electrical connection thereof as part of a photovoltaic field. More specifically as illustrated in FIG. 5, three of the photovoltaic devices 22 are located end for end supported by a suitable frame 42 at a suitable angle by ground supports 44 so as to receive light from the sun 46 and thereby produce electrical energy.

The processing of the system 20 shown in FIG. 1 begins with a sheet substrate 24 as shown in FIG. 4 having a glass sheet 26 that is 3/16 inch (5 millimeters) thick with a film 48 of tin oxide applied by atmospheric pressure chemical vapor deposition 0.04 microns thick to improve the optical quality when used for architectural purposes. A silicon dioxide film 50 is applied by atmospheric pressure chemical vapor deposition to a thickness of 0.02 microns over the tin oxide film to provide a barrier. Another tin oxide film 52 that is 0.3 microns thick and fluorine doped is applied over the silicon dioxide film 50 and functions as a reflective film in architectural usage with the fluorine doping increasing the reflectivity. This second tin oxide film 50 functions as an electrode for the photovoltaic device 22 as is hereinafter more fully described. Such a substrate 24 with the films 48, 50 and 52 deposited on the glass sheet 26 is commercially available and is one starting product from which the photovoltaic device 22 can be manufactured by the system 20 shown in FIG. 1.

With reference to FIG. 1, the system 20 includes a load station 54 on which the sheet substrate is loaded for the processing. After the loading, the substrate is transferred to a glass washing and drying station 56 of any commercially available type. A corner conveyor 58 transfers the substrate from the washing and drying station 56 to a laser scribing station 60 that cuts through the tin oxide film 52 at scribe lines 62 (FIG. 4) to isolate the cells 34 from each other. The scribed substrate is then transferred to another washing and drying station 64 to provide washing and drying prior to semiconductor deposition. Subsequently, the washed and dried substrate is transferred to a test/reject station 66 to make sure that the initial laser scribing has isolated the cells.

With continuing reference to FIG. 1, the system 20 includes a suitable heater 68 for heating the substrate to a temperature in the range of about 550° to 640° C. in preparation for semiconductor deposition. Thereafter, the substrate is transferred to apparatus 70 constructed in accordance with the present invention and including a deposition zone 72 which is disclosed as having three deposition stations 74, 76 and 78 for depositing layers of semiconductor material. More specifically, the first deposition station 74 deposits a cadmium sulfide layer 80 (FIG. 4) that is 0.05 microns thick and acts as an N-type semiconductor. The deposition station 76 shown in FIG. 1 deposits a cadmium telluride layer 82 which is 1.6 microns thick and acts as an I-type semiconductor. Thereafter, the deposition station 78 deposits another semiconductor layer 84 (FIG. 4) which as disclosed is 0.1 microns thick and is zinc telluride that acts as a P-type semiconductor. The semiconductor layers 80 and 82 have an interface 81 for providing one junction of the N-I type, while the semiconductor layers 82 and 84 have an interface 83 for providing another junction of the I-P type. These interfaces 81 and 83 normally are not abrupt on an atomic scale, but rather extend over a number of atomic layers in a transition region.

Apparatus 70 of the present invention is also illustrated in FIG. 1 as including a cooling station 86 that provides rapid cooling of the glass sheet substrate with the semiconductor material deposited thereon so as to strengthen the glass sheet as is hereinafter more fully described.

A corner conveyor 88 shown in FIG. 1 receives the substrate from the cooling station 86 and may also provide additional cooling thereof prior to transfer to a pin hole repair station 90. A suitable scanner of the pin hole repair station 90 scans the substrate to detect any pin holes in the deposited semiconductor layers by passing the substrate over a backlighted zone and then transferring the information to a computer controlled multiple head delivery system that fills the void with a suitable viscous nonconductive material. After such repair, the substrate is transferred to a second laser scribing station 92 that cuts scribes 94 (FIG. 4) through the semiconductor layers 80, 82 and 84 between the opposite lateral sides of the substrate at spaced locations from the scribes 62 in the tin oxide layer 52 which acts as the electrode. After the semiconductor scribing at station 92, the substrate is received by a corner conveyor 96 which also includes a suitable blower and vacuum for removing semiconductor material that is loosened by the scribing.

A sputtering station 98 receives the substrate from the corner conveyor 96 shown in FIG. 1 and deposits a nickel layer 100 (FIG. 4) over the semiconductor layers and on the sides and bottom surface of the scribe lines 94. This nickel sputtering is preferably performed by direct current magnitron sputtering and need only be about 100 angstroms thick to provide a stable contact for a subsequent deposition. Thereafter, the substrate is transferred to a sputtering station 102 that deposits an aluminum layer 104 which is 0.3 microns thick over the nickel layer 100 to act as an electrode on the opposite side of the semiconductor layers as the tin oxide film 52 which acts as the other electrode. The aluminum layer 104 is deposited by in-line multiple cathode, direct current magnitron sputtering. Thereafter the substrate is received by another sputtering station 106 that applies another nickel layer 108 over the electrode aluminum layer 104 to prevent oxidation of the aluminum layer.

A third laser scribing station 110 shown in FIG. 1 receives the substrate from the sputtering station 106 and then cuts scribe lines 112 (FIG. 4) through the electrode aluminum layer 104 and its adjacent nickel layers 100 and 108 as well as through the semiconductor layers to complete the isolation of the cells 34 between the opposite lateral sides of the substrate. Upon exiting the scribing station, a blower 114 removes any loose particle from the substrate prior to transferring to a module station 116 that tests the resultant photovoltaic deice under a predetermined illumination and the electrical output is measured for comparison with a standard to determine whether the product is satisfactory. The satisfactory substrates are then transferred to an assembly station 118 where bus bars are ultrasonically welded to the ends of each substrate and wire leads are soldered to the bus bars for use in connecting the photovoltaic device within an array. Thereafter, the photovoltaic devices 22 are transferred to an encapsulation station 120 where a suitable encapsulant layer 122 (FIG. 4) is applied and cured within an ultraviolet light chamber prior to transfer to an unload station 124. Subsequently, the completed photovoltaic devices 22 are assembled as previously described in connection with FIG. 5 into panels for constructing a photovoltaic array that generates electrical power.

It should be appreciated that the system 20 which with the apparatus 70 of this invention is used can be constructed with other stations than the ones illustrated. For example, rather than the laser scribing stations 60, 92 and 110 for defining the cells 34, it is possible to use photolithographic patterning to provide the cells.

With reference to FIGS. 6 and 7, the apparatus 70 for making a photovoltaic device in accordance with the present invention includes an enclosure 126 that extends between the heater 68 and the corner conveyor 88 previously described. This enclosure 126 as best illustrated in FIG. 7 include a lower wall 128, an upper wall 130, and side walls 132 as well as lower and upper seals 134 and 136 that seal between the walls so as to provide an enclosed interior capable of containing a controlled environment. Suitable fasteners or clamps can be utilized to maintain the sealed condition of the enclosure 126.

As illustrated in FIG. 6, the right upstream end of the enclosure 126 includes an entry valve 138 whose actuator 140 moves a valve element 142 to open the enclosure to receive a heated substrate 24 from the heater 68. Thereafter, the actuator 140 closes the valve element 142 to seal the enclosure. After the semiconductor deposition at the deposition stations 74, 76 and 78 of the deposition zone 72 as is hereinafter more fully described, another valve 144 at the downstream left end of the deposition zone is operated so that its actuator 146 opens a valve element 148 in order to allow the substrate 24 with the semiconductor materials coated thereon to pass to the cooling station 86. As this transfer takes place, a further valve 150 at the downstream end of the cooling station 86 is closed with its actuator 152 positioning a valve element 154 thereof in a closed position with respect to the downstream end of the enclosure 126. Valve 144 is closed after the transfer of the substrate 24 to the cooling station 86 and the valve 150 is thereafter opened to allow the cooled substrate 24 to be transferred from the cooling station 86 to the conveyor 88 for continued processing as previously described.

Figure 8:
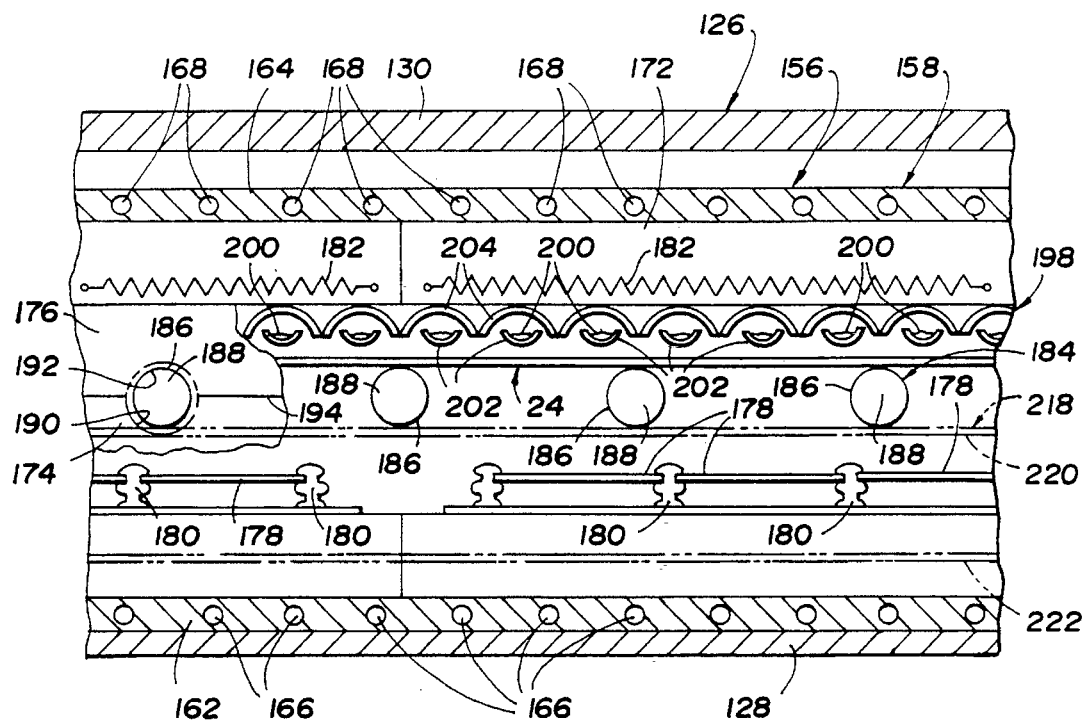
FIG. 8 is a partially broken away elevational view taken along the direction of line 8—8 in FIG. 7 to further illustrate the construction of the deposition station.

As best illustrated in FIGS. 6, 7 and 8, the deposition zone 72 of the apparatus includes an oven 156 located within the enclosure 126 and having a housing 158 that defines a heated chamber 160 that is communicated with the interior of the enclosure 126 such that the controlled environment therein is also within the heated chamber. This oven housing 158 includes lower and upper cooling plates 162 and 164 which have respective coolant passages 166 and 168 through which a suitable coolant flows. Housing 158 also includes lower and upper insulator walls 170 and 172 made from suitable insulation as well as including lower and upper side insulator walls 174 and 176 also made of suitable insulation. These insulator walls 170, 172, 174 and 176 cooperatively define the heated chamber 160 in which the semiconductor deposition takes place as is hereinafter more fully described. This semiconductor deposition is performed at elevated temperature provided by electrical heater elements 178 mounted by insulators 180 on the lower insulator wall 170 as shown in FIG. 8 and by suitable electric resistance heater elements 182 embedded within the upper insulator wall 172.

With combined reference to FIGS. 6 and 7, the apparatus 70 also includes a roller conveyor 184 having horizontal rolls 186 spaced from each other within the heated chamber 160 to support and convey the heated substrate 24 which, as previously described includes a glass sheet. Each roll 186 as best illustrated in FIG. 7 has at least one end 188, and preferably both of its ends, extending outwardly from the heated chamber 160 of the oven 156 through the housing 158 of the oven. More specifically, the roll ends 188 as shown in FIG. 8 extend outwardly through holes cooperatively provided by semicircular openings 190 and 192 in the lower and upper side insulator walls 174 and 176 at their engaged interface 194. The roll ends 188 are driven by a roll drive mechanism 196 of the roller conveyor 184. This roll drive mechanism 196 as shown in FIG. 7 is located within the interior of the enclosure 126 externally of the oven 156 to rotatively drive the roll ends as is hereinafter more fully described in order to convey the substrate 24 during the semiconductor deposition.

The deposition zone 72 of the apparatus 70 as illustrated in FIG. 6 and as previously discussed includes at least one deposition station and preferably three of the deposition stations 74, 76 and 78 within the oven 156 for supplying heated vapor that is deposited as a layer of semiconductor material onto the upwardly facing surface of the substrate 24 during conveyance thereof on the roller conveyor 184. More specifically, the one deposition station 74 provides heated vapors of cadmium sulfide that are deposited as the cadmium sulfide layer 80 (FIG. 4), while the deposition station 76 shown in FIG. 6 provides heated vapors that are deposited as the cadmium telluride layer 82 (FIG. 4) which has the interface 81 with the cadmium sulfide layer 80. Furthermore, the deposition station 78 shown in FIG. 6 provides heated vapors that are deposited as a further semiconductor layer such as the zinc telluride layer 84 that has the interface 83 with the cadmium telluride layer 82.

With combined reference to FIGS. 7 and 8, the one deposition station 76 which is also illustrative of the deposition station 74 and 78 is disclosed as including a source material holder 198 located within the oven 156 above the roller conveyor 184 to receive the source material 200 which in this instance is the cadmium telluride that is the main semiconductor material being deposited by the apparatus. This source material sublimes due to the heated condition of the oven chamber 160 to provide elemental cadmium and tellurium vapors that are deposited on the conveyed substrate 24 supported by the roller conveyor 184. More specifically, the source material holder 198 of the deposition station 176 includes at least one holder trough 202 that opens upwardly to receive the source material 200 and, preferably, there are a plurality of such holder troughs as is hereinafter more fully described. The deposition station also includes a deflector 204 located above the source material trough 202 and having a downwardly opening shape. As illustrated, there are a plurality of the holder troughs 202 which have elongated shapes and open upwardly extending parallel to the conveyor rolls with their opposite ends mounted by suitable supports 206 on the upper side insulator walls 176 within the oven chamber 160. Likewise, the deflectors 204 also have elongated shapes extending parallel to the conveyor rolls 186 and have their opposite ends mounted by the supports 206 on the upper side insulator walls 176. Both the troughs 202 and the deflectors 204 are preferably made from quartz so as to be capable of withstanding the elevated temperature to which the oven is heated during the semiconductor deposition. Furthermore, the deflectors 202 not only direct the heated vapors downwardly toward the substrate 24 for the deposition but also provide a shield that prevents material from falling downwardly from above and destroying the semiconductor quality being deposited. Also, as shown in FIG. 6, a pair of baffles 207 defines a slit that allows conveyance of the substrate 24 from deposition station 74 to the deposition station 76 but the baffles restrict the flow of heated vapors between these stations. Another pair of like baffles 207 provides the same function between deposition stations 76 and 78.

Figure 9:
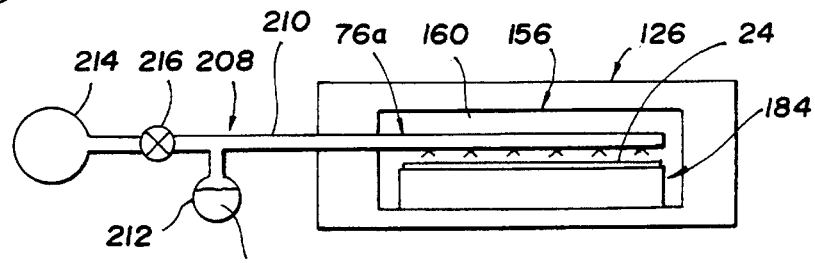
FIG. 9 is a somewhat schematic view illustrating another embodiment of the deposition station.

With reference to FIG. 9, another embodiment of the deposition station 76a includes a heated vapor supply 208 whose temperature can be controlled without affecting the temperature of the substrate 24 within the oven 156. The heated vapor supply includes a supply conduit 210 for providing a means for feeding heated vapor for deposition on the substrate 24 conveyed by the conveyor 184. More specifically, this embodiment is illustrated as including a heater 212 in which the source material 200 such as cadmium telluride is heated to provide the heated vapors of cadmium and tellurium supplied through the conduit 210 to the oven 156. This heater 212 is shown as being located externally of both the oven 156 and externally of the enclosure 126 with the conduit 210 extending into the enclosure and into the oven to supply the heated vapors for deposition. However, it should be appreciated that the heater 212 also could be located within the enclosure 126 externally of the oven 156 or within the oven heated chamber 160 without affecting the temperature of the substrate 24, such as by the use of insulation and/or remoteness in location from the substrate. Furthermore, source 214 of a carrier gas such as nitrogen is fed through a control valve 216 to assist in transferring the heated vapors from the heater 212 to the oven 156. Another advantage of the externally located source material heater 212 is that it is easily controlled independently of the temperature within the oven 156 in providing heating of the source material as necessary for the deposition.

Figure 10:
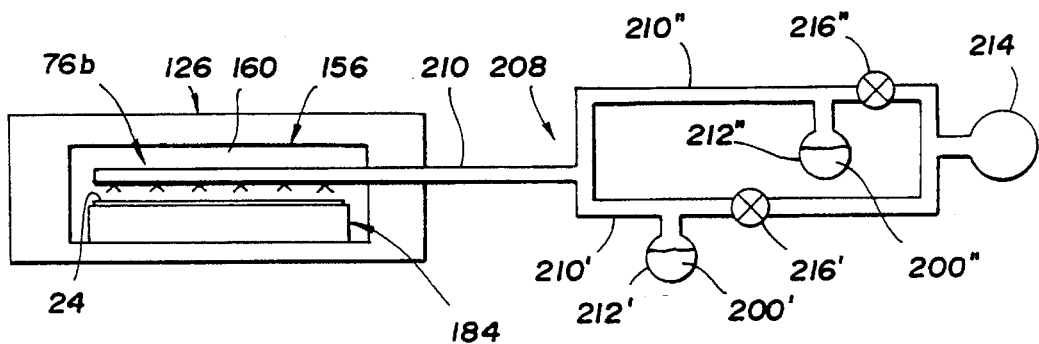
FIG. 10 is a somewhat schematic view of still another embodiment of the deposition station.

With reference to FIG. 10, a further embodiment of the deposition station 76b within the oven 156 is illustrated as also including a heated vapor supply 208 which includes a pair of the source material heaters 212' for respectively heating elemental cadmium and tellurium independently of each other. These heaters provide heated vapors through the conduit 210 to the interior of the oven 156 preferably by the use of a carrier gas such as nitrogen supplied from the source 214 through the control valves 216' and 216" respectively associated with the conduit branches 210' and 210".

As illustrated in FIG. 6, the drive mechanism 196 includes a continuous drive loop 218 having a driving reach 220 and a return reach 222. In the preferred construction illustrated in FIG. 7, there are a pair of the drive loops 218 that respectively support and rotatively drive the conveyor roll ends 188 at the opposite lateral sides of the oven. This drive loop 218 is preferably embodied by a drive chain which, as shown in FIG. 6, is received at its upstream end by a drive sprocket 224 and at its downstream end by another sprocket 226. Upper supports 228 on the enclosure side walls 132 as shown in FIG. 7 support the driving reaches 220 of the pair of drive loops 218 while lower supports 230 slidably support the lower return reaches 222 of the drive loops. A suitable electric motor driven drive shaft extending into the enclosure 126 through a seal rotatively drives the drive sprockets 220 that receive the drive chains in a counterclockwise direction to move the upper driving reaches 220 toward the right and thereby frictionally drive the conveyor rolls 186 counterclockwise to conveyor the substrates 24 toward the left. Positioners 232 shown in FIG. 7 may include suitable rollers which engage the roll ends 188 to position the conveyor rolls 186 along the length of the apparatus through both the deposition zone 72 and the cooling station 86.

Furnaces for heating glass sheets within the ambient, as opposed to a controlled environment within an enclosure in accordance with the present invention, are disclosed by U.S. Pat. Nos. 3,934,970; 3,947,242; and 3,994,711. These furnaces have roller conveyors whose rolls are frictionally driven by continuous drive loops, i.e. chains, in the same manner as the roller conveyor of this invention.

With reference to FIG. 6, the cooling station 86 includes lower and upper blastheads 234 and 236 respectively located below and above the roller conveyor 184 and having nozzles for supplying quenching gas such as nitrogen that rapidly cools the substrate 24 with the semiconductor material deposit thereon to thereby strengthen the glass sheet of the substrate. More specifically, this rapid cooling places the oppositely facing surfaces of the glass sheet in compression and its central portion between the surfaces in tension.

The process by which the photovoltaic device is made within the apparatus 70 described above begins by establishing a contained environment within the oven 156 by drawing a vacuum or establishing another controlled environment within the enclosure 126. This controlled or contained environment may include a suitable inert gas or an inert gas along with oxygen so long as there is no variable or variables that disrupt the controlled semiconductor deposition, such as variable water vapor in the atmosphere. It is also possible, as previously mentioned, to have a vacuum that constitutes the controlled environment contained within the enclosure 126 and hence also within the oven 156. The extent of the vacuum may be varied to provide best results. For example, it has been found that a vacuum of 5 torr is better than a vacuum of 1 torr in that there is a shorter mean free path for the heated semiconductor material vapors that are supplied during the processing as previously described and that there is less vapor travel and deposition on the opposite side of the substrate from the intended side on which the deposition is to take place. On the other hand, the deposition rate is higher at a lower pressure and, in addition, the uniformity of deposition depends on both pressure and temperature. Furthermore, the contained environment is heated to a temperature range above about 650° C. so the cadmium telluride does not deposit onto the oven walls, and the material holder 198 most preferably is heated to about 700° C. to sublime the cadmium telluride source material 200 at a sufficiently fast rate for rapid deposition.

The processing proceeds by introduction of heated vapors which for the main semiconductor material described above are of cadmium and tellurium. Conveyance of the sheet substrate 24 including the glass sheet 26 heated to a temperature in the range of about 550° to 640° C. within this contained environment provides continuous elevated temperature deposition of a layer of cadmium telluride onto the one surface 28 of the substrate as previously described so as to function as a semiconductor for absorbing solar energy. This cadmium telluride layer 82 as shown in FIG. 4 has an interface 81 with the cadmium sulfide layer 80 to provide an N-I junction adjacent the glass sheet side of the cadmium telluride layer. Likewise, the interface 83 of the cadmium telluride layer 82 with the zinc telluride layer 84 or another P-type semiconductor provides a P-I junction such that the resultant photovoltaic device is of the N-I-P type.

As previously described, the processing is preferably performed with the substrate 24 oriented horizontally within the contained environment with the one surface 28 of the substrate facing upwardly for the deposition of the cadmium telluride thereon and with the other surface 30 of the substrate facing downwardly and being supported within the periphery thereof for horizontal conveyance. This support of the substrate is preferably by the horizontally extending rolls 186 of the roller conveyor 184 during the deposition of the layer of cadmium telluride onto the upwardly facing surface 28 of the substrate, and such support allows relatively large glass sheet substrates to be continuously subjected to the semiconductor deposition while maintaining planarity despite the softness and tendency of the glass sheet to sag at its heated condition.

The processing proceeds as previously discussed in connection with FIG. 6 through the three deposition stations 74, 76 and 78 to deposit each of the semiconductor layers 80, 82 and 84 with the layers 80 and 82 having an interface 81 with each other and with the layers 82 and 84 having an interface 83 with each other. As discussed above, best results are achieved when the cadmium sulfide layer is deposited on the substrate surface 28 before the cadmium telluride layer 82 and when another P-type semiconductor layer 84 is deposited after the cadmium telluride layer.

After the deposition of the semiconductor materials as described above, the heated substrate is rapidly cooled within the cooling station 86 at a rate that provides compressive stresses that strengthen the glass sheet. More specifically, this processing is preferably performed by having the deposition of the layer of cadmium telluride deposited with the substrate 24 heated to a temperature in the range of about 570° to 600° C. and thereafter heating the substrate to a temperature in the range of about 600° to 640° C. from which the rapid cooling is performed to provide the compressive stresses that strengthen the glass sheet. Such processing reduces the time during which the glass sheet is in an elevated temperature so as to tend to sag while still providing a sufficiently heated condition prior to the cooling so as to facilitate the compressive stress build-up that strengthens the glass sheet.

The resultant photovoltaic device 22 made by the apparatus and processing described above has a thin-film layer 82 of the cadmium telluride deposited on the one surface 28 of the substrate 24 with a thickness that is effective within the range of about 1 to 5 microns and which has crystals of a size in the range of about ½ to 5 microns. This thin-film layer 82 of the cadmium telluride has an enhanced bond to the one surface of the substrate by virtue of the deposition thereon while the glass sheet is heated to the temperature in the range of about 550° to 640° C. within the contained environment that is heated to a temperature in the range above about 650° C. as previously described and into which vapors of cadmium and tellurium are introduced. This introduction provides the deposition on the one substrate surface 28 as the layer 80 of cadmium telluride.

Furthermore, the photovoltaic device 22 has the construction previously described in connection with FIG. 4 with respect to the other semiconductor layers and films which are deposited thereon to provide the electrodes and the cells which are separated from each other but connected in series through the semiconductor layers. It should be emphasized that the heat strengthening of the glass sheet 26 of the substrate by cooling from tempering temperature provides enhanced adherence of the cadmium telluride to the one surface 28 of the substrate.

As is apparent from the above description, the process and apparatus described produces a photovoltaic device that is capable of providing low cost electrical power generation.

While the best modes for carrying out the invention have been described in detail, other processes, apparatus and photovoltaic devices according to the invention are possible as defined by the following claims.

What is claimed is:

1. A process for making a photovoltaic device, comprising:

establishing a contained environment heated in a steady state during the processing;

introducing vapors of cadmium and tellurium into the contained environment; and conveying a heated sheet substrate including a planar glass sheet within the contained environment for continuous elevated temperature deposition of a layer of cadmium telluride onto one surface of the substrate to function as a semiconductor for absorbing solar energy, the substrate being oriented within the contained environment for the deposition of the cadmium telluride on the one surface thereof and with the other surface of the substrate being supported within the periphery thereof for conveyance while maintaining the planarity of the glass sheet.

2. A process for making a photovoltaic device as in claim 1 wherein the substrate is supported and conveyed within the contained environment by rolls of a roller conveyor during the deposition of the layer of cadmium telluride onto the one surface of the substrate.

3. A process for making a photovoltaic device as in claim 1 wherein another semiconductor material is deposited onto the one surface of the substrate as a separate layer having an interface with the layer of cadmium telluride.

4. A process for making a photovoltaic device as in claim 1 wherein another semiconductor material is deposited as another layer onto the one surface of the substrate before the layer of cadmium telluride which is deposited thereover and has an interface with the layer of cadmium telluride.

5. A process for making a photovoltaic device as in claim 4 wherein the layer of semiconductor material deposited onto the one surface of the substrate before the layer of cadmium telluride is cadmium sulfide.

6. A process for making a photovoltaic device as in claim 1 wherein another semiconductor material is deposited as another layer onto the one surface of the substrate after the layer of cadmium telluride and has an interface with the layer of cadmium telluride.

7. A process for making a photovoltaic device as in claim 1 wherein another semiconductor material is deposited as another layer onto the one surface of the substrate before the layer of cadmium telluride which is deposited thereover and has an interface with the layer of cadmium telluride, and wherein a further semiconductor material is deposited as a further layer on the one surface of the substrate after the layer of cadmium telluride and has a further interface with the layer of cadmium telluride.

8. A process for making a photovoltaic device as in any one of claims 3 through 7 wherein each layer of semiconductor material in addition to the layer of cadmium telluride is deposited by introducing vapors into the contained environment for the deposition on the one surface of the substrate during the conveyance thereof.

9. A process for making a photovoltaic device as in claim 1 wherein after the deposition of the layer of cadmium telluride the substrate is rapidly cooled at a rate that provides compressive stresses that strengthen the glass sheet.

10. A process for making a photovoltaic device as in claim 9 wherein the deposition of the layer of cadmium telluride is performed with the substrate heated to a temperature in the range of about 570° to 600° C., and thereafter the substrate being heated to a temperature in the range of about 600° to 640° C. from which rapid cooling is performed to provide the compressive stresses that strengthen the glass sheet.

11. A process for making a photovoltaic device comprising:

establishing a contained environment heated in a steady state during the processing;

introducing vapors of cadmium and tellurium into the contained environment; and conveying a heated sheet substrate including a planar glass sheet within the contained environment on rolls for continuous elevated temperature deposition of a layer of cadmium telluride onto one surface of the substrate to function as a semiconductor for absorbing solar energy, the substrate being oriented within the contained environment for deposition of the cadmium telluride on the one surface thereof with the other surface of the substrate being supported by the rolls within the periphery of the substrate for horizontal conveyance while maintaining the planarity of the glass sheet.

12. A process for making a photovoltaic device comprising:

establishing a contained environment heated in a steady state during the processing;

introducing vapors of cadmium and tellurium into the contained environment;

conveying a heated sheet substrate including a planar glass sheet within the contained environment on rolls for continuous elevated temperature deposition of a layer of cadmium telluride onto one surface of the substrate to function as a semiconductor for absorbing solar energy, the rolls supporting the substrate at the other surface thereof within its periphery for conveyance while maintaining the planarity of the glass sheet; and thereafter rapidly cooling the substrate with the layer of cadmium telluride deposited thereon to provide compressive stresses that strengthen the glass sheet.

13. A photovoltaic device comprising: a sheet substrate which includes a planar glass sheet and has oppositely facing surfaces each of which has an area of at least 1000 cm.$^2$; a thin-film layer of cadmium telluride deposited on one of the surfaces of the substrate with a thickness in the range of about 1 to 5 microns and having crystals of a size in the range of about ½ to 5 microns; and the thin-film layer of cadmium telluride having a bond to the one surface of the substrate by deposition thereon while the glass sheet is heated within a contained environment that is heated and into which vapors of cadmium and tellurium are introduced for deposition as the layer of cadmium telluride on the one surface thereof while the other surface thereof is supported within the periphery thereof for conveyance while maintaining the planarity of the glass sheet.

14. A photovoltaic device as in claim 13 further including a layer of another semiconductor material deposited on the one surface of the substrate and having an interface with the layer of cadmium telluride.

15. A photovoltaic device as in claim 13 further including another layer of another semiconductor material deposited on the one surface of the substrate before the layer of cadmium telluride and having an interface with the layer of cadmium telluride.

16. A photovoltaic device as in claim 15 wherein the layer of semiconductor material deposited on the one surface of the substrate before the layer of cadmium telluride is cadmium sulfide.

17. A photovoltaic device as in claim 13 further including another layer of another semiconductor material deposited on the one surface of the substrate after the layer of cadmium telluride and having an interface with the layer of cadmium telluride.

18. A photovoltaic device as in claim 13 further including another layer of another semiconductor material deposited on the one surface of the substrate before the layer of cadmium telluride and having an interface therewith, and a further layer of a further semiconductor material deposited on the one surface of the substrate after the layer of cadmium telluride and having a further interface with the layer of cadmium telluride.

19. A photovoltaic device as any one of claims 14 through 18 further including a first electrically conductive film on the one surface of the substrate over which the initially deposited layer is deposited, and a second electrically conductive film deposited on the one surface of the substrate over the finally deposited layer.

20. A photovoltaic device as in claim 19 wherein the glass sheet of the substrate is heat strengthened and has oppositely facing surfaces in compression and a central portion that is in tension; and the cadmium telluride having a bond that is cooled from tempering temperature and provides adherence thereof to the one surface of the substrate.

21. A photovoltaic device comprising: a substrate which has oppositely facing surfaces each of which has an area of at least 1000 cm.$^2$; the substrate including a planar glass sheet that is heat strengthened and has oppositely facing surfaces in compression and a central portion that is in tension; a thin-film layer of cadmium telluride deposited on one of the surfaces of the substrate with a thickness in the range of about 1 to 5 microns and having crystals of a size in the range of about ½ to 5 microns; and the thin-film layer of cadmium telluride having a bond to the one surface of the substrate by deposition thereon while the glass sheet is heated within a contained environment that is heated and into which vapors of cadmium and tellurium are introduced for deposition on the one surface thereof as the layer of cadmium telluride on the one surface thereof while the other surface thereof is supported within the periphery thereof for conveyance while maintaining the planarity of the glass sheet.

22. A photovoltaic device as in claim 21 wherein the substrate includes a first electrically conductive film on the one surface thereof, another layer of another semiconductor material deposited on the one surface of the substrate and having an interface with the layer of cadmium telluride, and a second electrically conductive film deposited on the one surface of the substrate over the finally deposited layer.

23. A photovoltaic device as in claim 21 wherein the substrate includes a first electrically conductive film on the one surface thereof, another layer of another semiconductor material deposited between and having interfaces with both the first electrically conductive film and the layer of cadmium telluride, a further layer of a further semiconductor material deposited over the layer of cadmium telluride and having an interface therewith, and a second electrically conductive film deposited over the further layer of the further semiconductor material.

* * * * *